(12) United States Patent
Lai et al.

(10) Patent No.: US 7,061,764 B2
(45) Date of Patent: Jun. 13, 2006

(54) HEAT SINK CLIP WITH ROTATING CAM

(75) Inventors: Cheng-Tien Lai, Santa Clara, CA (US); LiangHui Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/812,527

(22) Filed: Mar. 29, 2004

(65) Prior Publication Data
US 2004/0190262 A1    Sep. 30, 2004

(30) Foreign Application Priority Data
Mar. 28, 2003    (TW)    ............... 92204909 U

(51) Int. Cl.
*H05K 7/20*    (2006.01)
(52) U.S. Cl. .............. 361/704; 257/718; 174/16.3; 165/80.3
(58) Field of Classification Search ............ 24/295, 24/296, 457–458; 248/505, 510; 257/719, 257/726, 727; 165/80.3, 185; 29/890.03; 361/703–704
See application file for complete search history.

(56) References Cited

U.S. PATENT DOCUMENTS

| | | | |
|---|---|---|---|
| 6,318,452 B1 * | 11/2001 | Lee .................... | 165/80.3 |
| 6,343,015 B1 | 1/2002 | Huang et al. | |
| 6,501,656 B1 * | 12/2002 | Peng et al. ............ | 361/703 |
| 6,731,504 B1 * | 5/2004 | Liu ...................... | 361/704 |
| 6,778,395 B1 * | 8/2004 | Dong et al. ........... | 361/704 |

FOREIGN PATENT DOCUMENTS

TW    270560    2/1996

* cited by examiner

*Primary Examiner*—Lynn Feild
*Assistant Examiner*—Zachary M. Pape
(74) *Attorney, Agent, or Firm*—Wei Te Chung

(57) ABSTRACT

A clip (10) includes a main body (20), a buckling piece (40), and a camming member (30). The main body includes a pressing part (22), a first leg (24) extending downwardly from one end of the pressing part, and a supporting portion (26) extending horizontal from an opposite end of the pressing part. The supporting portion defining a hole. The cam member located above the supporting portion which comprises a cam (32) and a handle (34) extending from the cam for rotating the cam. The buckling piece located below the supporting portion which comprises a connecting part (42) and a second leg (44) extending from the connecting part. The connecting part move up through the hole of the supporting portion to pivotally connect with the cam, and the heak sink can be secured to the electronic device by rotating the cam to a locked position from an unlocked position.

17 Claims, 4 Drawing Sheets

HEAT SINK CLIP WITH ROTATING CAM

BACKGROUND OF THE INVENTION

1. Field of the Invention

The present invention relates to a clip for attaching a heat sink to an electronic device, and more particularly a clip which is easy to operate.

2. Description of Prior Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sink assemblies are frequently used to dissipate heat from these electronic devices.

Referring to FIG. 6, a conventional heat sink clip includes a central pressing part 100, two spring portions 102 extending slantingly upwardly from opposite ends of the pressing part 102, and pair of arms 104 depending from opposite distal ends of the spring portions 102. Each arm 104 defines two apertures 106 therein, one above the other. An ear 108 is stamped outwardly from each arm 104 at the upper of the two apertures 106, for enabling a tool to be engaged with the arm 104. However, it is inconvenient to require a tool every time the clip is used to attach the heat sink to a CPU and detach the heat sink therefrom.

Thus, an improved heat sink clip which overcomes the above-mentioned problems is desired.

BRIEF SUMMARY OF THE INVENTION

Accordingly, an object of the present invention is to provide a clip which is easy to operate.

Another object of the present invention is to provide a clip which can readily and firmly fasten a heat sink to a heat sink socket.

To achieve the above-mentioned object, a clip in accordance with a preferred embodiment of the present invention includes a main body comprising a pressing part adapted to press the heat sink to the electronic device, a first leg extending downwardly from one end of the pressing part, and a supporting portion extending from an opposite end of the pressing part, the supporting portion defining a hole; a cam member located above the supporting portion, the cam member comprising a cam and a handle extending from the cam for rotating the cam, and a buckling piece located below the supporting portion, the buckling piece comprising a connecting part and a second leg extending from the connecting part; the connecting part moves up through the hole of the supporting portion to pivotally connect with the cam, and the heak sink can be secured to the electronic device by rotating the cam to a locked position from an unlocked position.

In achieving the said objectives of the invention herein, the technological means and overall structural innovations are disclosed to demonstrate the most feasible embodiments. Furthermore, the brief description of the drawings below and the following detailed description will enable a further understanding of the present invention, wherein:

DESCRIPTION OF THE PREFERRED EMBODIMENT

Figure 1:
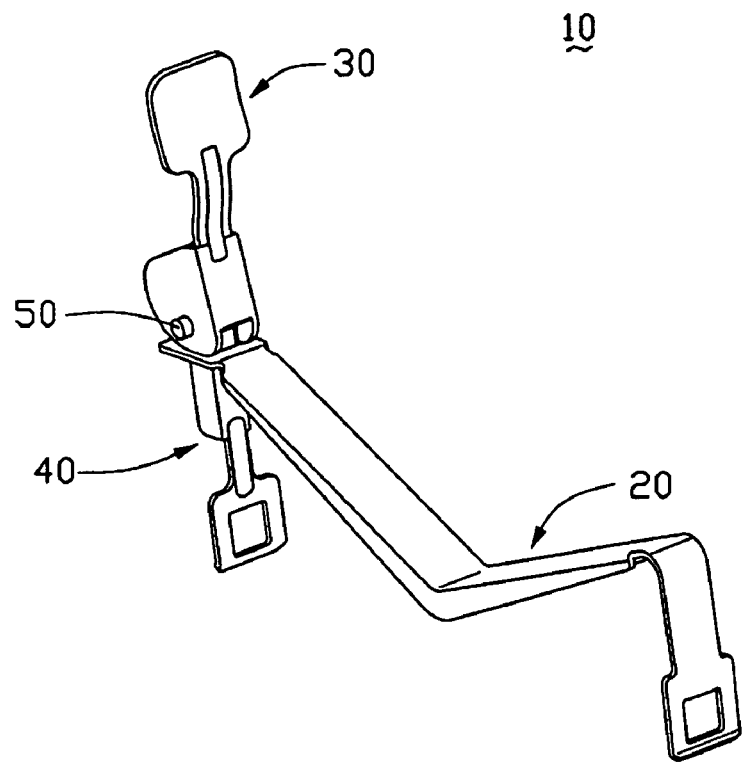
FIG. 1 is an isometric view of a clip in accordance with the preferred embodiment of the present invention.

Referring to FIG. 1, a clip 10 in accordance with the preferred embodiment of the present invention comprises a main body 20, a camming member 30, a buckling piece 40, and a cylindrical pivot post 50.

Figure 2:
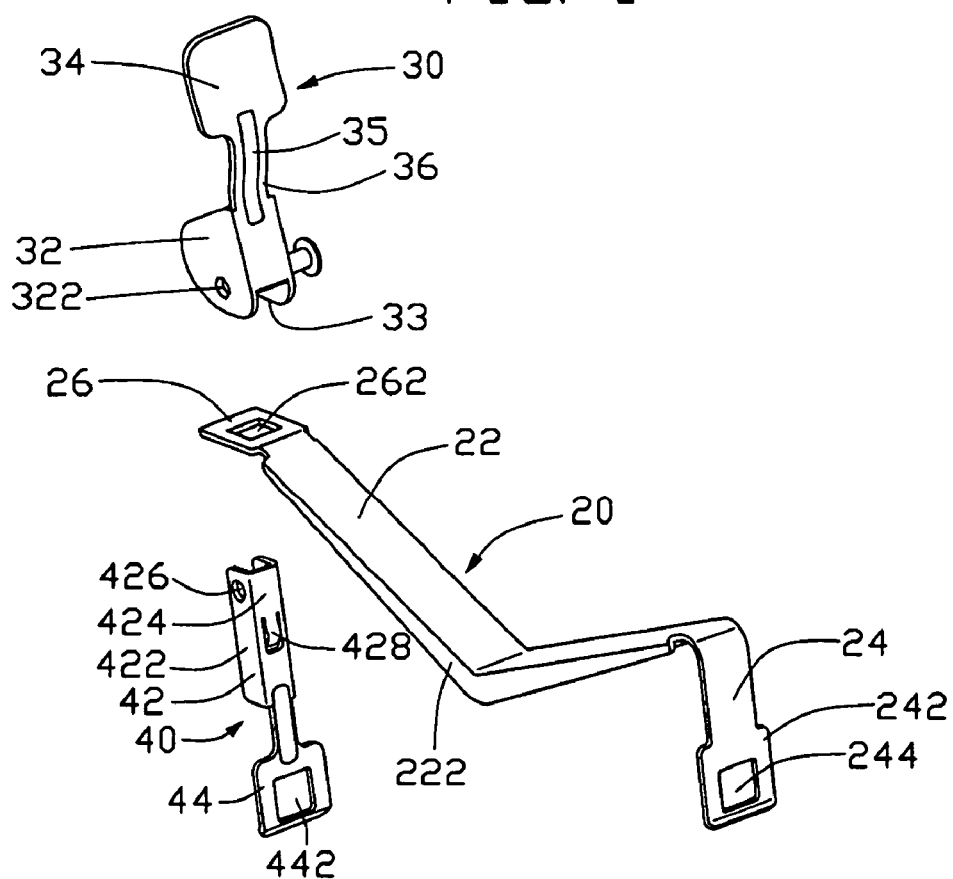
FIG. 2 is an exploded view of the clip of FIG. 1.

Referring to FIG. 2, the main body 20 can be fabricated from heat-treated carbon steel, which can be punched or cut to the desired form. In the preferred embodiment, the main body 20 is formed from a single metal sheet by stamping, and comprises a pressing part 22, a first leg 24 and a supporting portion 26. The pressing part 22 is generally V-shaped. Two generally V-shaped reinforcing ribs 222 are formed downwardly from opposite longitudinal sides of the pressing part 22. A vertical thickness of each reinforcing rib 222 tapers from a center thereof to opposite ends thereof respectively. The first leg 24 extends downwardly from one end of the pressing part 22, and forms a rectangular end 242. A first hole 244 is defined in the rectangular end 242. The supporting portion 26 extends horizontally from an opposite end of the pressing part 22. A rectangular hole 262 defined in the supporting portion 26.

The buckling piece 40 comprises an upper connecting part 42, and a second leg 44 extending from the connecting part 42. The connecting part 42 comprises a main plate 424, and two reinforcing ribs 422 extending perpendicularly from opposite longitudinal sides of the main plate 424 respectively. Two pivot holes 426 (only one visible) are defined in top ends of the reinforcing ribs 422 respectively. A spring finger 428 is formed in the main plate 424 by stamping. A cross-sectional area defined by the main plate 424 and the ribs 422 is less than an area of the rectangular hole 262 of the supporting portion 26. The second leg 44 comprises a lower rectangular end (not labeled). A second hole 442 is defined in the rectangular end.

The camming member 30 can be produced, for example, by a molding process. The camming member 30 comprises a cam 32, a substantially rectangular handle 34, and a first connecting arm 36 interconnecting the cam 32 and the handle 34. The cam 32 is substantially bifurcated, with two parallel portions interconnected by a main plate (not labeled). A gap 33 defined between said portions of the cam 32 has a width greater than a corresponding width of the main plate 424 of the connecting part 42, so that the gap 33 can receive the connecting part 42 therein. Furthermore, a distance between said portions of the cam 32 is greater than a corresponding width of the rectangular hole 262. Two pivot holes 322 are defined in said portions of the cam 32 respectively. The connecting arm 36 is bifurcated, comprising two parallel portions separated by a slit 35. Said portions of the connecting arm 36 connect with the main plate (not labeled) of the cam 32, for providing suitable strength for the camming member 30. The camming member 30 can be selectively positioned in the locked position or the unlocked position by operating the handle 34.

In assembly, the connecting part 42 of the buckling piece 40 is passed up through the rectangular hole 262 of the supporting portion 26, and received in the gap 33 of the cam 32. The connecting part 42 is positioned so that the pivot holes 426 are aligned with the pivot holes 322. The pivot post 50 is inserted into the pivot holes 322, 426. A top end of the connecting part 42 is thus retained in the gap 33 of the cam 32, and the clip 10 is fully assembled.

Figure 3:
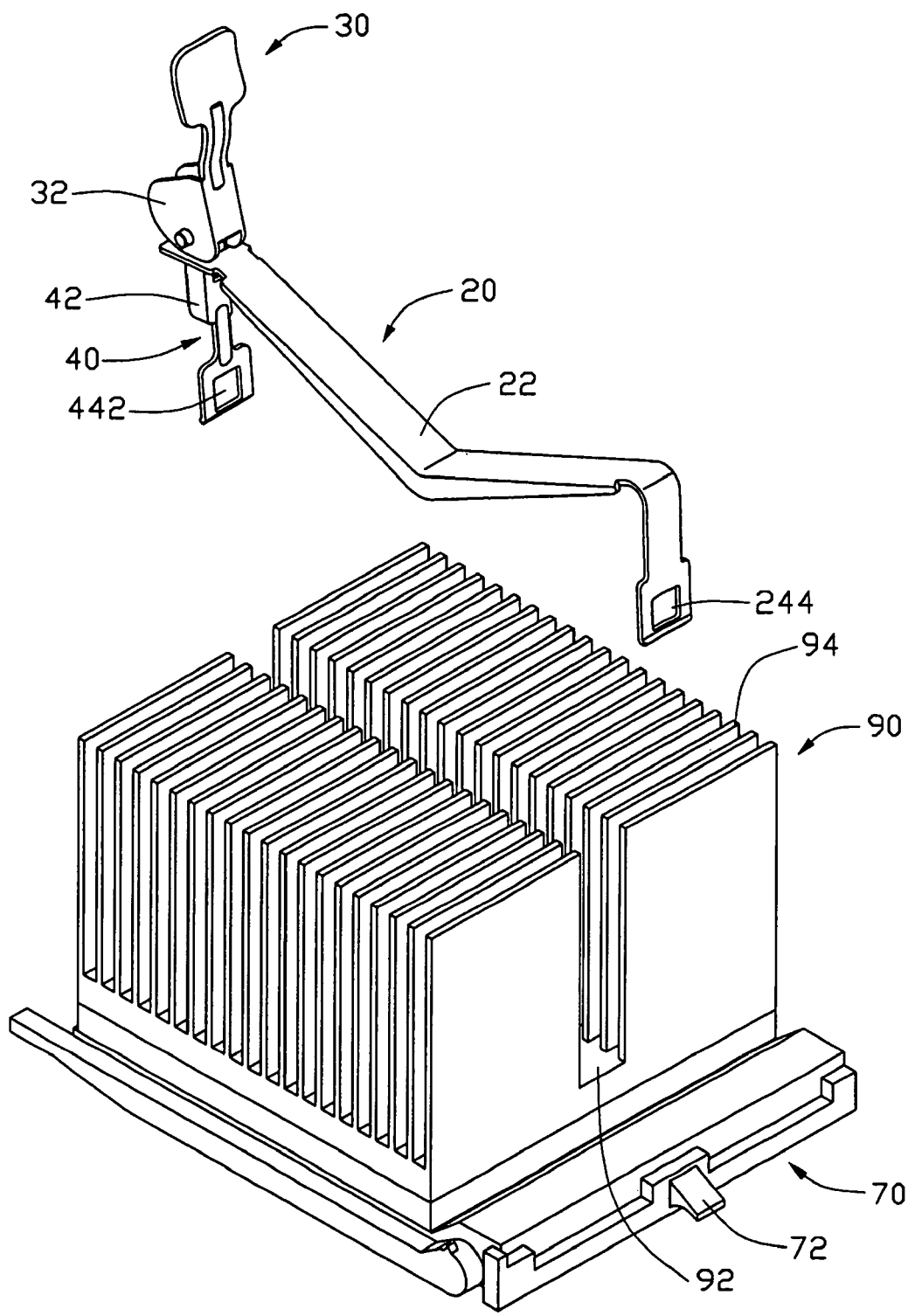
FIG. 3 is an isometric view of the clip of FIG. 1 ready to retain a heat sink supported on a socket.
Figure 4:
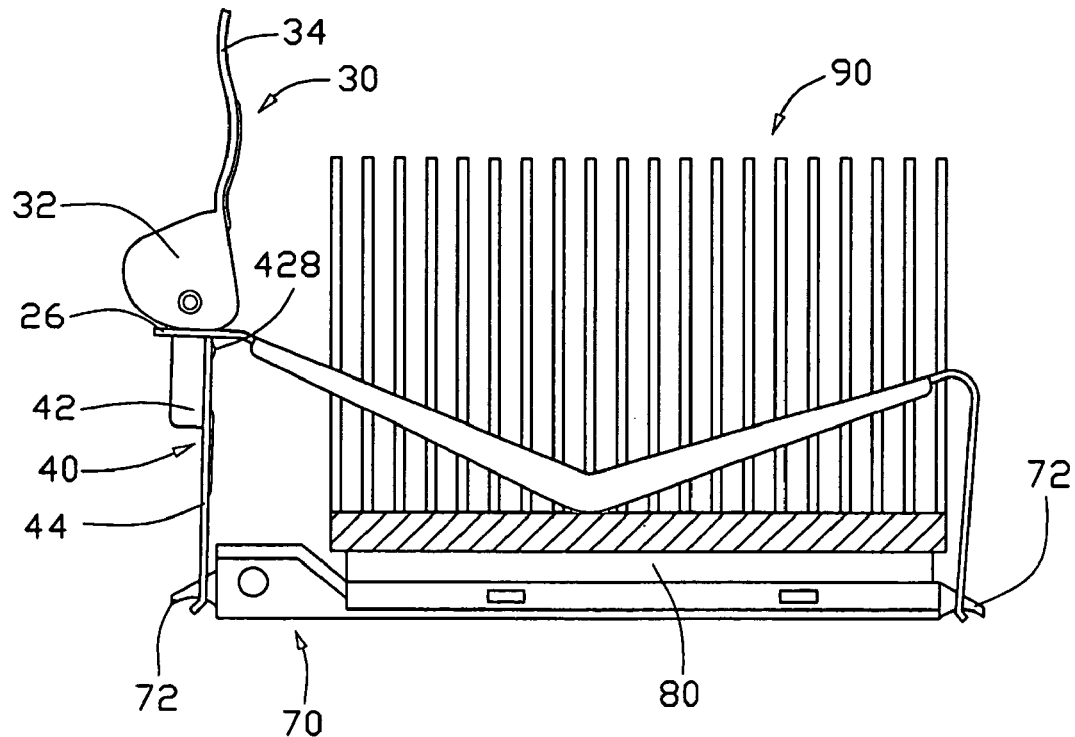
FIG. 4 is a side elevation of the components of FIG. 3 assembled together, with part of the heat sink cut away, and showing the clip in an unlocked position ready to press the heat sink on the socket.
Figure 5:
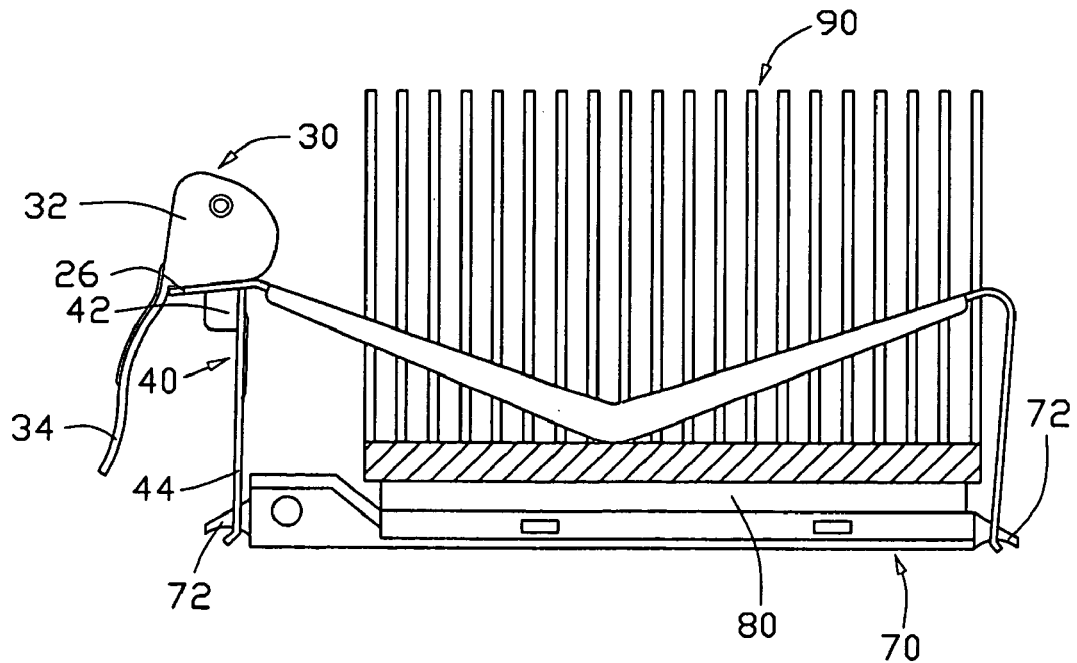
FIG. 5 is similar to FIG. 4, but showing the clip in a locked position.
Figure 6:
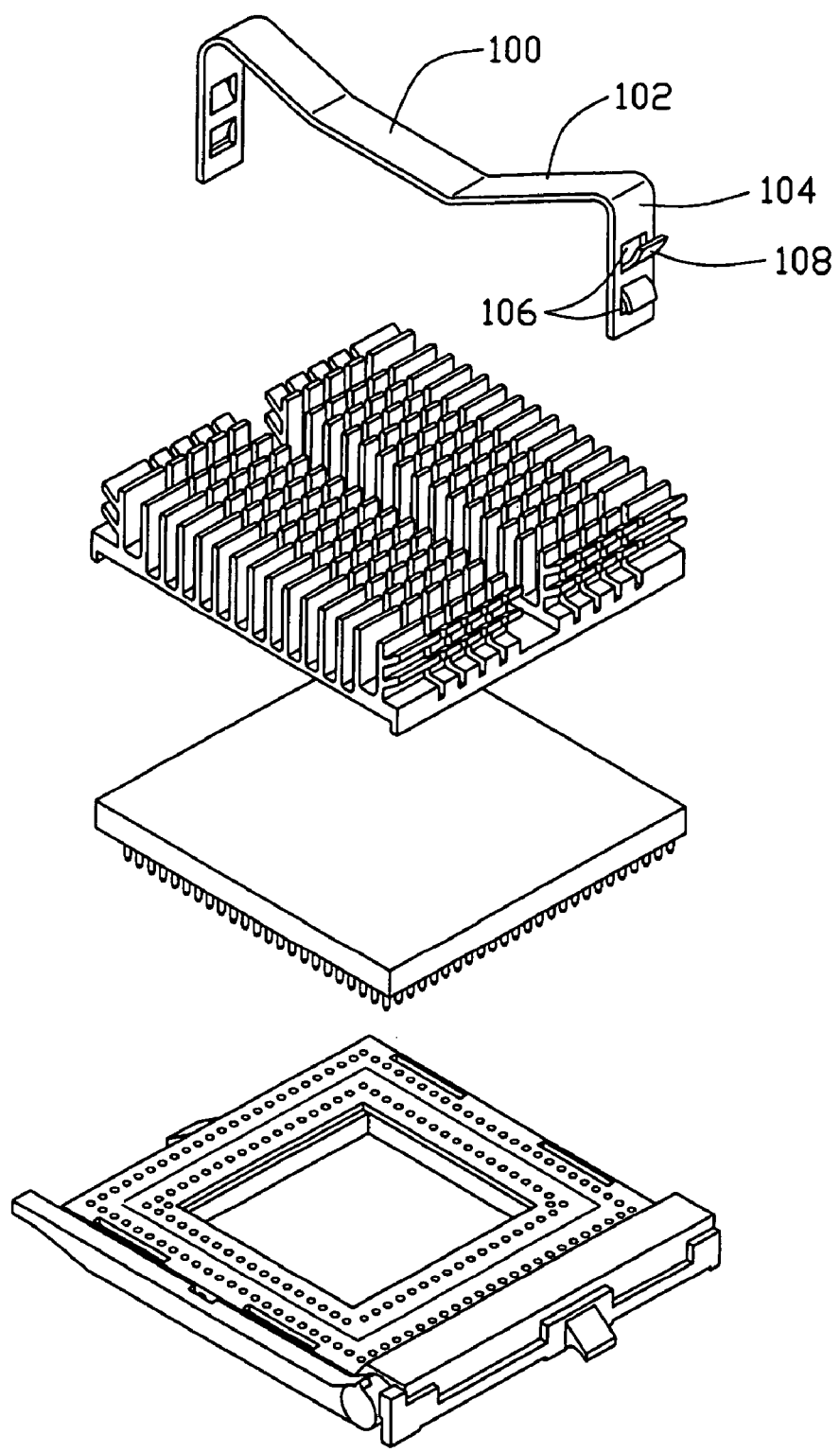
FIG. 6 is an exploded, isometric view of a conventional clip for securing a heat sink onto an electronic device that is mounted on a socket.

Referring to FIGS. 3–5, in use, a conventional heat sink 90 includes a base (not labeled), and a plurality of parallel fins 94 extending upwardly from the base. A slot 92 is transversely defined through a center of the plurality of fins 94, for receiving the clip 10 therein. A width of the slot 92 is substantially the same as a corresponding width of the pressing part 22. A socket 70 is used to support a heat-generating electronic device such as a CPU 80 therein. Two tabs 72 are formed at opposite sides of the frame 70 respectively. The heat sink 90 is positioned in the frame 70, with the slot 92 spanning between the tabs 72 of the socket 70. The pressing part 22 of the main body 20 of the clip 10 is positioned in the slot 92 of the heat sink 90. The first and second holes 244, 442 of the clip 10 loosely receive the tabs 72 of the socket 70 respectively. The clip 10 is in the unlocked position, with the camming member 30 in a substantially upright position (see FIG. 4).

The handle 34 is then rotated downward approximately half a revolution. Said portions of the cam 32 surmount a maximum radius thereof until the camming member 30 rests in a locked position (see FIG. 5). Simultaneously, the connecting part 42 of the buckling piece 40 moves up through the rectangular hole 262 of the supporting portion 26, with the spring finger 428 riding over an edge of the supporting portion 26 at the rectangular hole 262. In the locked position, edges of said portions of the cam 32 push down on the supporting portion 26. Thus, elastic deformation of the pressing part 22 of the clip 10 produces forces that press the heat sink 90 on the socket 70. The spring finger 428 is located above the supporting portion 26. That is, the spring finger 428 can block the pressing part 22 from abruptly restoring original state during disassembling to provide a secure operation. The interaction between the clip 10 and the heat sink 90 tends to maintain the heat sink 90 seated within the socket 70, and to maintain the heat sink 90 in intimate thermal contact with a heat-generating electronic device such as a CPU 80 that is located within the socket 70. Thus the cam 32 is not able to readily self-unlock. An external force by way of operation of the handle 34 needs to be applied in order to unlock the cam 32.

In operation of the clip 10 of the present invention, it is only necessary to overcome friction forces created between the supporting portion 26 of the main body 20 and the cam 32 in order to provide the moment needed to rotate the camming member 30. Therefore the force needed to operate the handle 34 is relatively small. Additionally, the spring finger 428 can block the pressing part 42 from abruptly restoring deformation during disassembling. Forthermore, the clip 10 is readily moved from the locked position to the unlocked position by rotating the handle 34 upwardly.

In an alternative embodiment of the present invention, the first hole 244 of the main body 20 and the second hole 442 of the buckling piece 40 can be replaced by two hooks respectively. Accordingly, the two tabs 72 of the socket 70 can be replaced by two holes respectively.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip adapted to secure a heat sink to an electronic device, the clip comprising:

a main body comprising a pressing part adapted to press the heat sink to the electronic device, a first leg extending downwardly from one end of the pressing part, and a supporting portion extending from an opposite end of the pressing part, the supporting portion defining a hole therein;

a cam member located above the supporting portion, the cam member comprising a cam and a handle extending from the cam for rotating the cam, and a buckling piece located below the supporting portion, the buckling piece comprising a connecting part and a second leg extending from the connecting part; wherein the connecting part moves up through the hole of the supporting portion to pivotally connect with the cam, and the heat sink can be secured to the electronic device by rotating the cam to a locked position from an unlocked position.

2. The clip of claim 1, wherein two reinforcing ribs extend downwardly from opposite longitudinal sides of the pressing part.

3. The clip of claim 2, wherein a vertical thickness of each of the reinforcing ribs tapers from a center thereof to opposite ends thereof respectively.

4. The clip of claim 1, wherein the first leg of the main body comprises a lower rectangular end, and said end defines an aperture therein.

5. The clip of claim 1, wherein the second leg of the buckling piece comprises a lower rectangular end, and said end defines an aperture therein.

6. The clip of claim 1, wherein the cam is substantially bifurcated, with two parallel portions thereof receiving the connecting part of the buckling piece therebetween.

7. The clip of claim 1, wherein the connecting part of the buckling piece comprises a main plate and two reinforcing ribs extending perpendicularly from opposite longitudinal sides of the main plate respectively, and the spring finger is provided in the main plate.

8. The clip of claim 7, wherein in the locked position, the spring finger is located above the supporting portion, whereby the spring finger protects the pressing part from abruptly restored deformation.

9. The clip of claim 7, wherein the cam defines two pivot holes in said parallel portions respectively, the reinforcing ribs of the connecting part define two pivot holes respectively, and a pivot extends through the pivot holes of said parallel portions and the pivot holes of said reinforcing ribs.

10. The clip of claim 1, wherein said buckling piece is only linked to the cam member, and is not connected to the supporting portion.

11. A clip adapted to secure a heat sink to an electronic device, the clip comprising:

a main body comprising a pressing part adapted to press the heat sink to the electronic device, a first leg extending downwardly from one end of the pressing part, and a supporting portion extending from an opposite end of the pressing part;

a cam member located above the supporting portion, the cam member comprising a cam and a handle extending from the cam for rotating the cam, and a buckling piece located below the supporting portion, the buckling piece comprising a connecting part moving up through the supporting portion to pivotally connect with the cam and a second leg extending from the connecting part;

wherein the heat sink can be secured to the electronic device by rotating the cam to a lacked position from an unlocked position, and the connecting part provides a spring finger which is located below the supporting portion at the unlocked and above the supporting portion at the locked position whereby the spring finger protects the pressing part from abruptly restored deformation.

12. The clip of claim 11, wherein two reinforcing ribs extend downwardly from opposite longitudinal sides of the pressing part.

13. The clip of claim 12, wherein a vertical thickness of each of the reinforcing ribs tapers from a center thereof to opposite ends thereof respectively.

14. The clip of claim 11, wherein said buckling piece is only linked to the cam member, and is not connected to the supporting portion.

15. A clip assembly comprising:
a main body defining an elongated pressing part with a first leg extending downwardly from one end of said pressing part;
a supporting portion located on the other end of the pressing part; and
an actuation combination including a cam member and a buckling piece,
the cam member essentially located on said supporting portion,
the buckling piece essentially located below the supporting portion and defining a second leg opposite to said first leg,
a lower portion of the cam member pivotally linked to an upper portion of the buckling piece,
said supporting portion defining a structure confining at least one of said cam member and said buckling piece so as to prevent said actuation combination from being dropped away from the main body while still allowing said combination to be moveable relative to the main body in a range; wherein neither the cam member nor the buckling piece is connected to the supporting portion, and when said cam member is pivotally moved relative to the buckling piece and said supporting portion, said buckling piece is up and down moved relative to the supporting portion so as to perform a tension or reined manner relative to a heat sink.

16. The clip assembly of claim 15, wherein both said first leg and said second leg define locking means at lower ends thereof, respectively.

17. The clip assembly of claim 15, wherein said first leg is integrally formed with the main body.

* * * * *